United States Patent
Chiang

(10) Patent No.: US 8,519,455 B2
(45) Date of Patent: Aug. 27, 2013

(54) LIGHT SIGNAL TRANSFER DEVICE WITH CONDUCTIVE CARBON LINE

(76) Inventor: Kuo-Ching Chiang, New Taipei (TW)

(*) Notice: Subject to any disclaimer, the term of this patent is extended or adjusted under 35 U.S.C. 154(b) by 0 days.

(21) Appl. No.: 13/419,440

(22) Filed: Mar. 14, 2012

(65) Prior Publication Data

US 2012/0199892 A1  Aug. 9, 2012

Related U.S. Application Data

(63) Continuation of application No. 12/880,177, filed on Sep. 13, 2010, now Pat. No. 8,362,490.

(51) Int. Cl.
*H01L 31/112* (2006.01)

(52) U.S. Cl.
USPC ........... 257/290; 257/291; 257/292; 257/461; 257/E31.073

(58) Field of Classification Search
USPC .................. 257/290, E31.073, 291, 292, 293, 257/294, 461, 462, 463, 464; 438/48, 70
See application file for complete search history.

(56) References Cited

U.S. PATENT DOCUMENTS

| | | | | |
|---|---|---|---|---|
| 5,075,244 A * | 12/1991 | Sakai et al. | ..................... | 438/59 |
| 5,536,932 A * | 7/1996 | Hack et al. | ................. | 250/208.1 |
| 5,808,676 A * | 9/1998 | Biegelsen et al. | ............. | 348/308 |
| 6,908,839 B2 * | 6/2005 | Rhodes | ........................ | 438/595 |
| 7,112,511 B2 * | 9/2006 | Hong | ............................. | 438/427 |
| 8,319,307 B1 * | 11/2012 | Williams | ...................... | 257/461 |
| 2004/0238887 A1 * | 12/2004 | Nihey | ........................... | 257/347 |
| 2006/0234519 A1 * | 10/2006 | Pan et al. | ...................... | 438/795 |

* cited by examiner

*Primary Examiner* — Thinh T Nguyen
(74) *Attorney, Agent, or Firm* — Chih Feng Yeh; Huntington IP Consulting Co., Ltd.

(57) ABSTRACT

A light signal transfer device comprises a substrate having a gate dielectric layer; a source and drain doped regions formed in the substrate; a gate formed on the gate dielectric layer; a carbon nano-tube material formed under the gate dielectric layer to act a channel; and a photo-diode doped region formed adjacent to one of the source and drain doped regions, wherein the areas of the channel and the photo-diode doped region are fixed, the carbon nano-tube material reducing area of the channel and increase photo reception area for the photo-diode doped region to improve performance of the light signal transfer device.

6 Claims, 6 Drawing Sheets

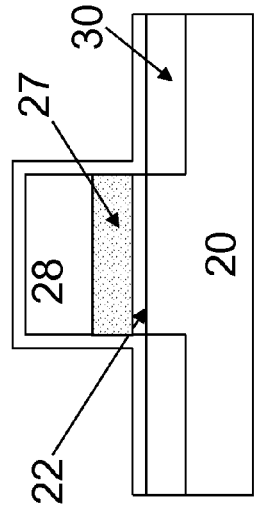
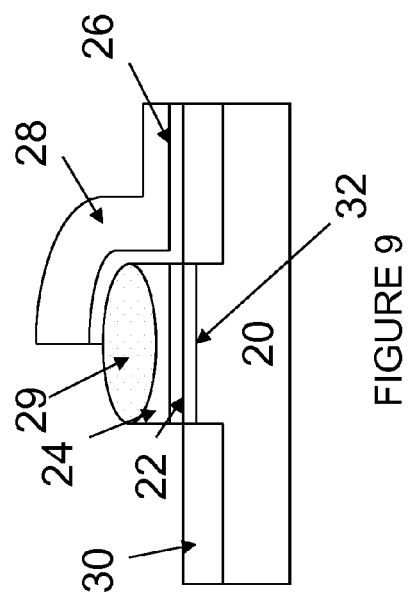

LIGHT SIGNAL TRANSFER DEVICE WITH CONDUCTIVE CARBON LINE

CROSS-REFERENCE TO RELATED APPLICATION

This application is a Continuation Application of an application Ser. No. 12/880,177, filed on Sep. 13, 2010, entitled "Liquid Crystal Panel with Conductive Carbon Line", which is a divisional of an application Ser No. 12/076,928, filed on Mar. 25, 2008, entitled "Semiconductor Memory with Conductive Carbon". The contents of the above-mentioned patent application is hereby incorporated by reference herein in its entirely and made a part of this specification.

TECHNICAL FIELD

The present invention relates to a light signal transfer device, and more specifically, to a light signal transfer device with conductive carbon (or conductive polymer) for channel.

BACKGROUND OF THE RELATED ART

A photodiode is a type of photodetector capable of converting light into either current or voltage, depending upon the mode of operation. Many diodes designed for use specifically as a photodiode use a PIN junction rather than a p-n junction, to increase the speed of response. Sensor is a device that converts an optical signal into an electronic signal. Extra circuitry next to each photo sensor converts the light energy to a voltage. Additional circuitry on the chip may be included to convert the voltage to digital data. The signal performance is dependent on the photoreception. However, when the device is scaled down with trend, the photo diode surface is also reduced along with the shrinkage. Thus, the minimized area of the photodiode cannot offer good performance.

SUMMARY OF THE INVENTION

A light signal transfer device comprises a substrate having a gate dielectric layer; a source and drain doped regions formed in the substrate; a gate formed on the gate dielectric layer; a carbon nano-tube material formed under the gate dielectric layer to act a channel; and a photo-diode doped region formed adjacent to one of the source and drain doped regions, wherein the areas of the channel and the photo-diode doped region are fix, the carbon nano-tube material reducing area of the channel and increase photo reception area for the photo-diode doped region to improve performance of the light signal transfer device. Pluralities of isolation layers laminated over the light signal transfer device and at least one conductive pattern formed there between. The conductive pattern is formed with carbon nano-tube or conductive polymer. A lens is formed over the pluralities of isolation layers to guide incident light into the photo-diode doped region.

A light signal transfer device comprises a substrate having a gate formed in the substrate; a gate dielectric layer formed over the gate; a carbon nano-tube material formed over the gate dielectric layer to act a channel; a source and drain doped regions formed over the substrate and formed adjacent to the carbon nano-tube material; and a photo-diode doped region formed adjacent to one of the source and drain doped regions, wherein the areas of the channel and the photo-diode doped region are fix, the carbon nano-tube material reducing area of the channel and increase photo reception area for the photo-diode doped region to improve performance of the light signal transfer device.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 9 is a cross sectional view of a semiconductor wafer illustrating the memory according to the present invention.

FIG. 10 is a cross sectional view of a semiconductor wafer illustrating the memory according to the present invention.

FIG. 11 is a cross sectional view of a semiconductor wafer illustrating the memory according to the present invention.

DETAILED DESCRIPTION OF THE PREFERRED EMBODIMENT

Figure 1:
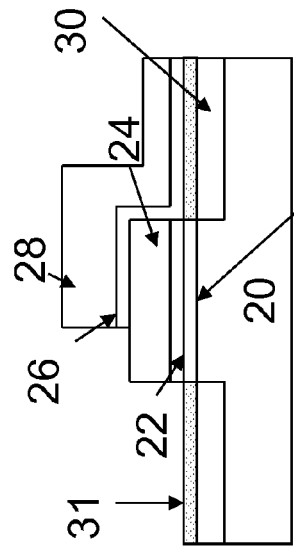
FIG. 1 is a cross sectional view of a semiconductor wafer illustrating the memory according to the present invention.

The present invention proposes a novel method to fabricate a memory. In the method, the operation speed for storing data can be increased by the cell structure. The detail description will be seen as follows. A semiconductor substrate is provided for the present invention. In a preferred embodiment, as shown in the FIG. 1, a single crystal silicon substrate 20 crystallographic orientation is provided. The substrate 20 includes a pattern of active areas comprising separated doped region such as the source/drain regions. A thin dielectric layer 22 is formed on the substrate 20 to act as gate dielectric layer. Typically, the dielectric layer 22 can be grown in oxygen ambient at a temperature of about 700 to 1100 degrees centigrade. Other method, such as chemical vapor deposition, can also form the oxide. Subsequently, a conductive layer 24 is formed on the oxide 22 to act the floating gate. The conductive layer 24 may be formed of doped polysilicon, in-situ doped polysilicon. For an embodiment, the doped polysilicon layer 20 is doped by phosphorus using a PH3 source. An isolation layer 26 is conformally formed on the substrate 20 and the gate structure. The material for forming the isolation layer 26 can be nitride, oxide ($SiO_2$) or ($HfO_2$). ($ZrO_2$)、($TiO_2$)、($HfTiO$)、($HfAIO$)、($La_2O_3$)、($LaAIO$). One suitable method for the oxide layer includes thermal oxidation and deposition by CVD. For example, Low Pressure Chemical Vapor Deposition (LPCVD), Plasma Enhance Chemical Vapor Deposition (PECVD), High Density Plasma Chemical Vapor Deposition (HDPCVD). The control gate 28 is formed on the isolation layer. A photo-resist pattern is formed on the stacked layers, followed by etching the layers by using the photo-resist pattern as etching mask, thereby forming the gate structure on the silicon substrate 20.

Figure 2:
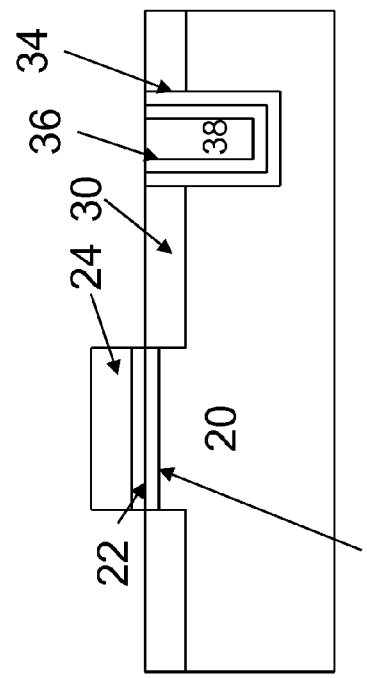
FIG. 2 is a cross sectional view of a semiconductor wafer illustrating the memory according to the present invention.

Next, the stacked gate is used as mask to perform the ion implantation for forming the source/drain 30 adjacent to the gate, as shown in FIG. 1. FIG. 2 is similar structure to the last embodiment. The structure in FIG. 2 is called split-gate structure to distinguish the stacked gate. The control gate shifts from the floating gate with a distance and overlaps a part of the floating gate. It should be noted that the spacers may be formed on the sidewall of the gate structure and the dosage type and profile may be changed, such as the structure may have the LDD, halo-implant, or pocket implantation. Another embodiment is shown. Most of the structure is similar to FIG. 1. An oxidation is performed to the floating gate to oxide the upper surface of the floating gate to form thick oxide 29, thereby forming peak at the corner to increase the erasing speed.

At least one conductive carbon 32, for instance, carbon nano-tube (CNT) 32 is located under the gate dielectric 22 of the dual-gates structure. Namely, the conductive carbon 32 connects the S/D 30. The CNT may be formed with at least one to fifty layers structure. The diameters of the CNT maybe 1-2 nanometers and the length is 10-100 nano-meters or shorter. The S/D 30 can be formed by deposition, sputter instead of implantation in order to form the CNT. Alternatively, the CNT 22 maybe keeps a distance with the oxide 22. The embodiment may be includes spacers such as FIG. 10.

The formation of CNT is to heat the organic compound having carbon to generate the carbon atoms. One example is to input the reaction gas such as CH4 to the reaction chamber, and the carbon atoms will be separated from the gas when the reaction gas contacts the high temperature substrate. The carbon will be growth. Another method is to drive the C—H compound with CH4 through the nanometers substrate. The conductive carbon has the characteristics of semiconductor property to improve the performance of the device and scaled down the size. During the operation, the carrier of the memory will flow through the tube.

Figure 3:
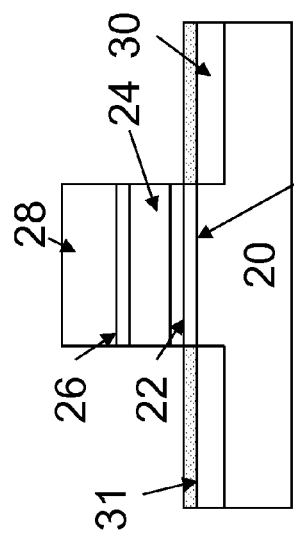
FIG. 3 is a cross sectional view of a semiconductor wafer illustrating the memory according to the present invention.

FIG. 3 is another embodiment that is multi-bits memory, a control gate 28 controls the carrier trapping structures 25. The carrier trapping structures are used to define the digital zero and one. The carrier trapping structure 25 is isolated from the sidewall of the control gate by the isolation layer 26. A dielectric layer 28 is conformally formed over the isolation layer 26, followed by isotropically etching the layer, thereby forming the spaces 28 to create the carrier trapping structure 25. The anisotropic etching includes RIE, plasma etching. Next, the S/D is formed 30. Similarly, the CNT 32 is formed prior art to form the control gate and the CNT connects the S/D 30. The source and drain is formed by performing an ion implantation to dope ions into the substrate 201 using the gate structure 203a and sidewall spacers 206a as a mask. Silicide process may be used on the S/D 30 in each embodiment of the present invention. The material for the silicide maybe TiSi2 CoSi2NiSi. A typical silicide process is introduced on the exposed surface of the silicon substrate on the source and drain regions to reduce the resistance. The gate structure 203a is used as the control gate and the nitride spacers 25 acting as carrier trapping structure.

A sectional view of a two-bit nonvolatile memory cell in accordance with the present invention is shown in FIG. 3. The memory cell includes a substrate 201 having two buried PN junctions, one is the left junction and the other is the right junction. CNT Channels are located between the two junctions during operation. Above the main channel is oxide. On top of the oxide layer is a control gate. L-shape structure 25 is formed on the sidewall of the gate structure. The vertical portion of the L-shape structure 25 is attached on the side wall of the gate, and the lateral portion where tunneling will be occurred is formed on the substrate. Spacer 26 is used for charge trapping and is preferably comprised of silicon nitride. The hot electrons are trapped as they are injected into the Spacer 26.

The memory cell is capable of storing two bits of data, a right bit and a left bit. The two bit memory cell is a symmetrical device. The left junction serves as the source terminal and the right junction serves as the drain terminal for the right bit programming. Similarly, for the left bit programming, the right junction serves as the source terminal and the left junction serves as the drain terminal. The operating mode of the present invention for the right bit is to offer a bias Vgp is applied on the silicide over the gate structure for writing, the source node has 1 nA-1 mA current Isp. Channel hot carrier current is generated in the substrate 20 under the spacer 25 between the gate structure and the drain. The channel hot carrier current will injects into the spacer 25 via the lateral portion of the L-shape structure adjacent to the drain side due to the source, drain keep a distance from the channel under the gate. Electrons are trapped in the portion of nitride spacer near but above and self-aligned with the drain region because the strongest electric field forms there. The carriers are therefore stored in the nitride spacer 25 that functions as the floating gate of the nonvolatile memory. The nitride spacer 25 on the drain side is defined as "digital one", while the spacer without carrier therein on the drain side is referred to "digital zero". Hence, a set of memory unit "XY" is written as "X1" or "X0". It should be understood that the source and drain terminals for the second bit are reversed compared to the source and drain terminals for the first bit. Therefore, the data status can be programmed or defined as "00", "01", "10" or "11" by applying the drain-write voltage Vdp and source current Isp depending on the right bit cell or left bit cell. If the two-bits are desired to be programmed as "11", the drain-write voltage Vdp and source current Isp are introduced on the left bit and right bit, respectively. The cell is operated based upon "forward program and reverse read" scheme. The read current in the channel is reverse compared to the one of programming. The cell shows totally different channel sections, source/drain and SiN spacer arrangement. One of the key features is that the source/drain regions keep a distance to the channel under the gate. Under such arrangement, the present invention is capable of storing 4-bits information rather than two bits. Similarly, the digital data can be erased. In FIG. 11, the carrier trapping structure 27 is under the control gate 28, and it is consisted by ONO or ON.

Figure 4:
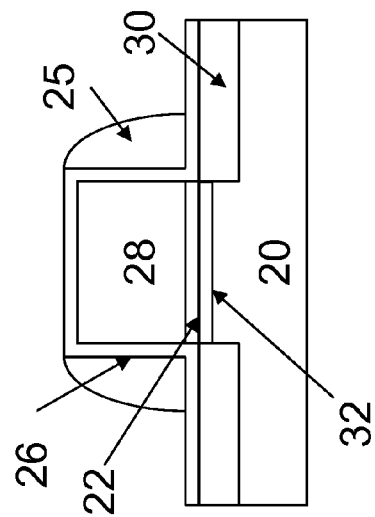
FIG. 4 is a cross sectional view of a semiconductor wafer illustrating the memory according to the present invention.

FIG. 4 illustrates CNT 32 located between the S/D of a memory. The drain 30 of the memory connects to a structure with conductive/isolation/conductive to store carriers. For example, the memory has a trench formed within the substrate. The conductive/isolation/conductive structure is formed within the trench from outer to inner portion. A first conductive layer 34 is connected to the drain 30. A CNT 32 is located between the drain and source to improve the operation speed. The isolation could be oxide, NO, ONO.

Figure 5:
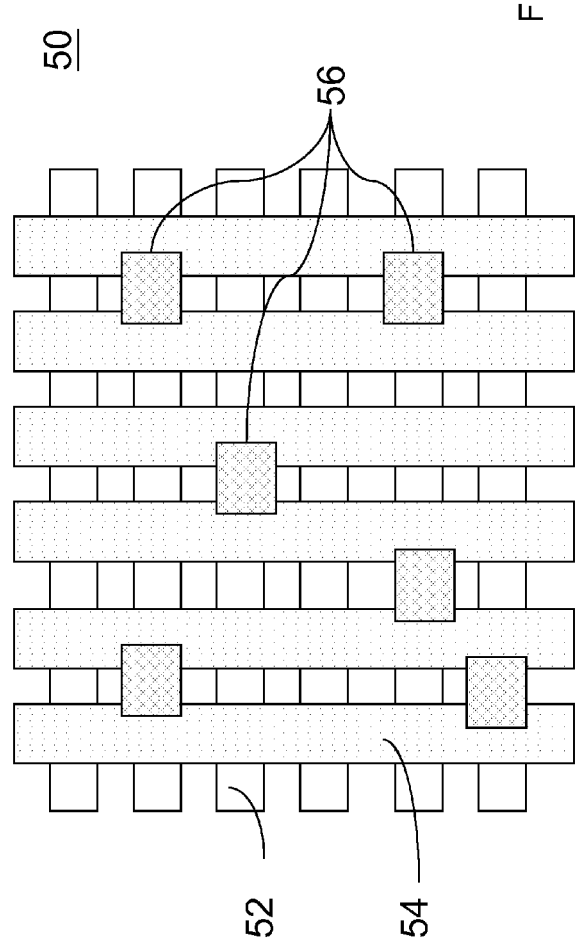
FIG. 5 is a top view of a semiconductor wafer illustrating the memory according to the present invention.
Figure 6:
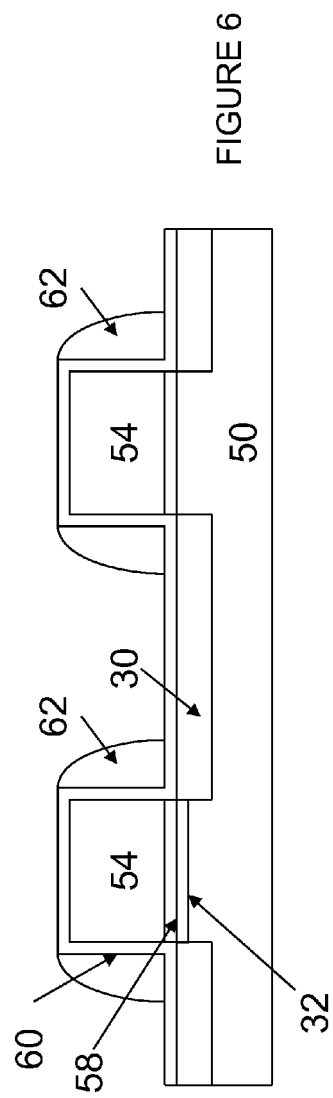
FIG. 6 is a cross sectional view of a semiconductor wafer illustrating the memory according to the present invention.

FIG. 5 is the ROM of the present invention. The ROM includes bit lines 52 arranged on the substrate 50, the bit lines 52 are typically formed by ion implantation, for instance, buried bit lines. Word lines (gates) 54 are formed over the substrate and vertically cross the bit lines 52 to construct a checkerboard configuration. The word lines 54 are perpendicular to the bit lines 52. At least one conductive carbon (such as CNT) is located a portions of the non-intercrossing area of the bit lines 52 and word lines 54 to act as the semiconductor area. The cross sectional view is shown in FIG. 6.

It includes two kinds of devices on the substrate 50. Oxide layer 58 is under the gate 54 and a liner layer 60 may be formed along the gate structure. Spacers 62 is formed by the well-known manner on the gate 54. Conductive carbon such as CNT 32 is formed in one kind of the devices. Another one has no the CNT. Current will be generated along the CNT between the S/D. On the contrary, there is no current in another device. Therefore, the digital status can be determined by the configuration. The present invention provides a nano-scale ROM.

Figure 7:
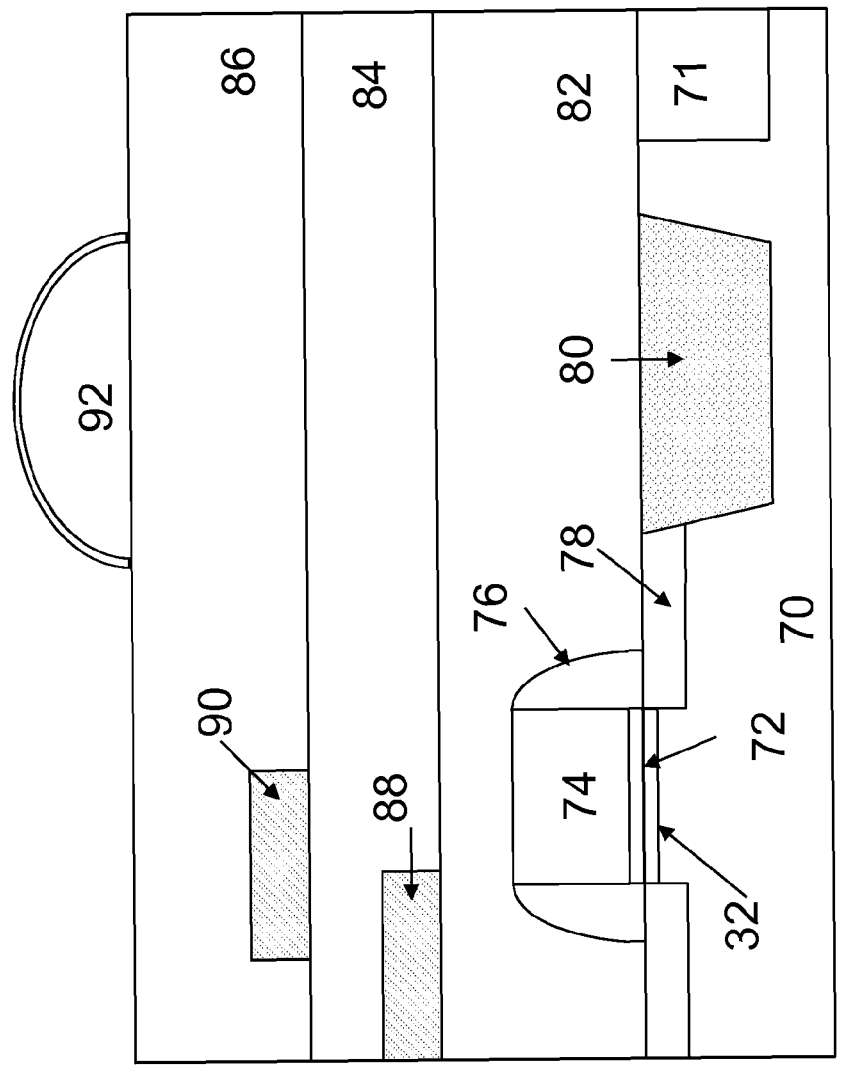
FIG. 7 is a cross sectional view of a semiconductor wafer illustrating the semiconductor device according to the present invention.

FIG. 7 illustrates a gate dielectric layer 72 such as oxide, gate 74 are formed over the substrate. The gate structure includes spacer 76 on the side walls and doped regions 78 are formed in the substrate adjacent to the gate. The substrate includes an isolation region 71 that is formed by STI or FOX. A photo-diode implantation region 80 is formed in the substrate and connected to the doped regions 78 to receive photo. Conductive carbon, such as CNT 32 or conductive polymer is formed under the gate and between the source and drain of the doped regions 78 to act the channel. The dosage of the ion implantation region of the photo-diode 80 is about 1E12-1E14/cm2, the energy of the implantation is about 50-180 keV. The surface of the doped region 80 can be formed with dosage about 1E15-1E16/cm2, the energy of the implantation is about 5-40keV to prevent dark current. The above dosage, energy and doping type can be modified. Pluralities of isolation layers 82, 84, 86 are laminated over the conductive pattern 88, 90. The pattern 88, 90 may be formed by CNT or conductive polymer. As know in the art, the CMOS image sensors are typically sensitive to infrared ray. As a result, infrared light will degrade the image sensor. The response of silicon has a peak at about 750 nm but extends out in the near infrared to about 1,100 nanometers. It is therefore desirable to filter out wavelengths in the near infrared ray. Consequently, an infrared filter is typically used in CMOS image sensors in the prior art. Another disadvantage of the image sensor is that it is difficult to achieve a high fill factor, the fill factor is the percentage of the pixel area sensitive to light. In particular, the conventional structure includes interconnection lines formed with metal and polysilicon which will block some of the light from reaching photodiodes, thereby reducing the fill factor. The present invention employs the transparent CNT pattern to act the conductive pattern over the photodiode to increase the fill fact due to the structure will allow more light pass and reach to the photodiode, but the conventional structure will reduce the passing light percentage. Further, CNT has its optical characteristics to serves as an optical filter for infrared radiation, thereby eliminating the need for a separate infrared filter. A lens 92 is formed over the isolation layer to guide the incident light into the photo-diode region 80. The present invention may speed up the operation speed and prevent dark current. If the areas occupied by the channel and the photo-diode are fix, the smaller area of the channel is, the larger area of the photo-diode is for increasing the area to receive the light or photo, thereby increasing the photo reception and enhance the light signal transfer. The performance of the channel will not be downgraded even with smaller dimension due to the conductive performance of the carbon nano-tube is better than the buck silicon.

Figure 7A:
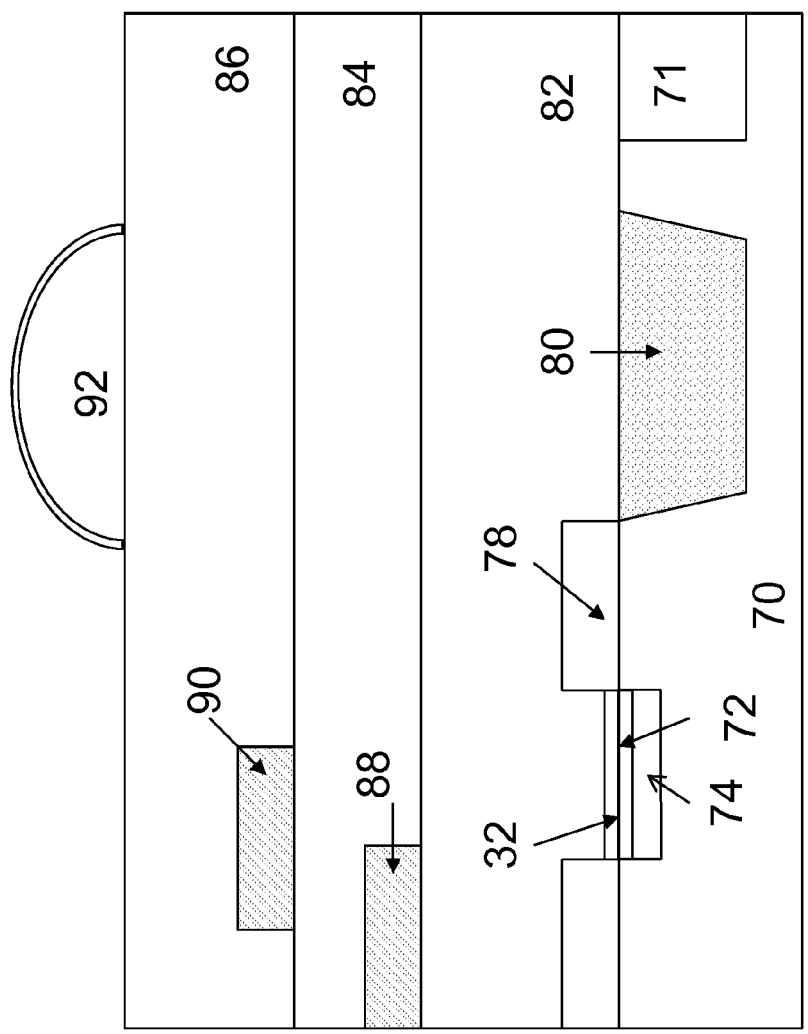
FIG. 7A is a cross sectional view of a semiconductor wafer illustrating the semiconductor device according to the present invention.
Figure 8:
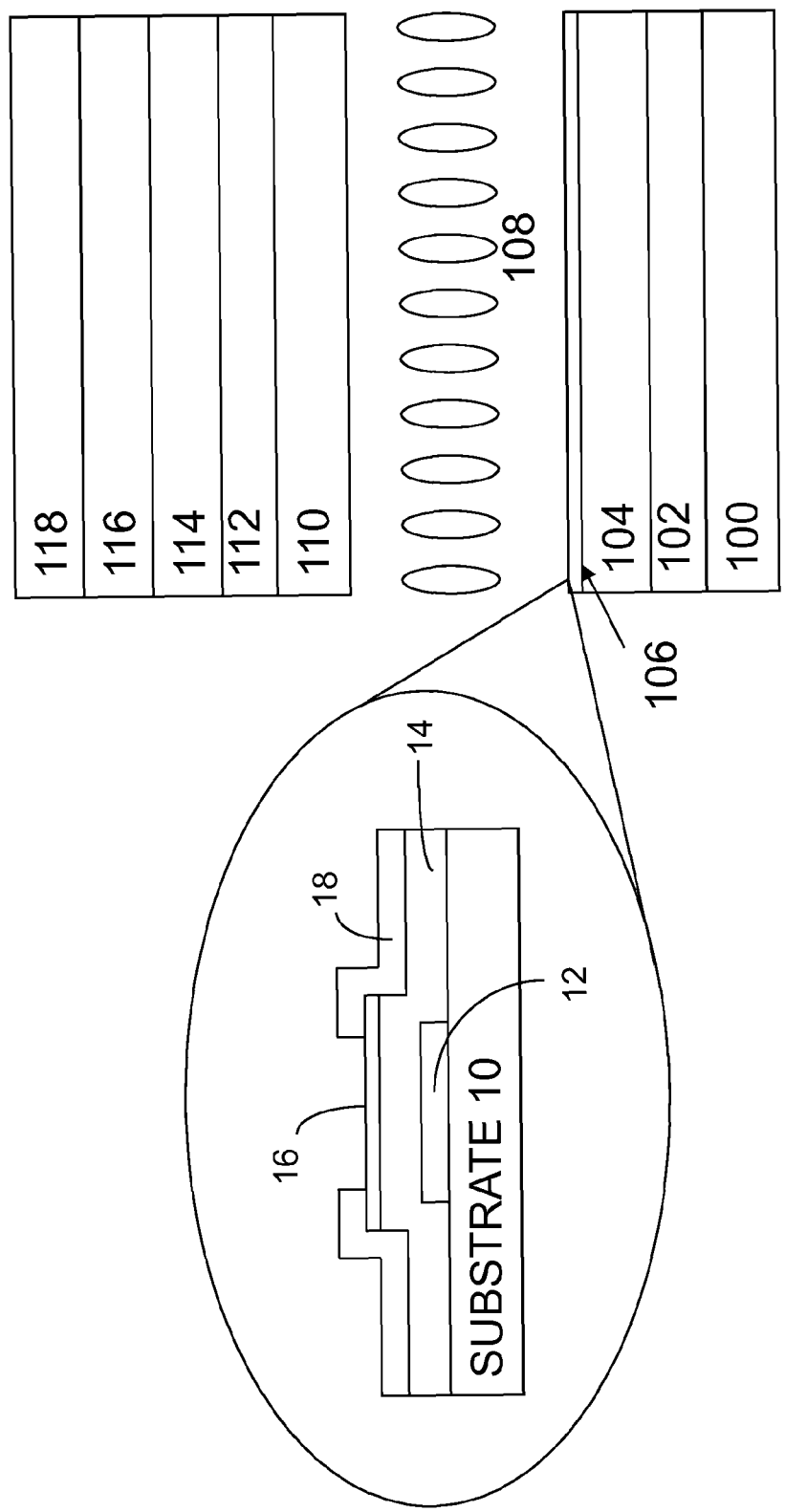
FIG. 8 is a cross sectional view of a semiconductor wafer illustrating the display module according to the present invention.

The transistor structure of the FIG. 8 can be used for the embodiment FIG. 7. The gate of the embodiment may be buried into the substrate 10 to lower the high of the device as shown in FIG. 7A. FIG. 7A illustrates another embodiment of the present invention, almost of the elements is similar with the FIG. 7, the gate is buried into the substrate, a trench may be formed initially, and polysilicon is filled into the substrate, or the gate is defined by photo-masking and ion implanting is performed to form the gate 74. Then, gate dielectric layer 72 is subsequently formed over the gate 74. Conductive carbon, such as CNT or conductive polymer 32 is formed over the gate dielectric layer 72. The S/D doped regions 78 are formed over the CNT channel 32 and it is formed between the source and drain doped regions 78. The CNT and the conductive polymer have better conductivity than prior art bulk silicon even minimizing the size of the structure. Further, the present invention may expand the photo reception area as the areas of the channel and the photodiode doped region are fixed. The present invention offer even topography and lower high to the device, further, it may offer better photo reception due to the gate is under the channel.

Another embodiment is illustrated in FIG. 8, which includes a display unit having a first (rear) polarizer 100, a first transparent (such as glass) substrate 102 and a first transparent electrode 104. A TFT is formed over the first transparent electrode 104. LC (liquid crystals) 108 is formed over the TFT 104. A second (front) transparent electrode 110 is formed over the LC 108 and a second (front) transparent substrate 112 and color filter 114 are subsequently formed over the LC 108. A protection glass 116 and second (front) polarizer 118 are formed over the color filter 114. The TFT 106 is formed over the substrate 10 and the gate 12 of the TFT is patterned and isolation layer 14 is formed over the gate 12. CNT 16 is configured over the isolation 14 and aligned to the gate 12 as a nano-scale channel. S/D (source and drain) 18 substantially covers the terminals of the CNT 16 and coupled to the S/D. Alternatively, the first and/or second transparent electrodes are formed by conductive carbon (such as CNT) and/or conductive polymer. It may be formed by print to simplify the process. As described above, the source electrode and the drain electrode 18 can be formed in a single-layered or multi-layered structure from a conductive carbon as well. The conductive carbon with nano-scale may reduce the width of the conductive electrode, thereby reducing the scale of electrode and increasing the resolution without down grade the performance.

The CNT and the conductive polymer have better conductivity than prior art bulk silicon even minimizing the size of the structure. It may improve the electronic transmitting rate with transparent characteristic when it is formed with thinner thickness. The transparent, conductive layer of CNT is coated with an ionic polymer, and the composite is used as a transparent electrode. The interaction between the polymer and the CNT in the conductive network is beneficial to the overall goal of forming useful coatings for numerous consumer devices. The CNT-polymer composite offers the characteristic of transparent and good conductivity. The method of forming CNT is illustrated above. In an embodiment of the present invention, a high density plasma CVD method maybe used, and an inductively coupled plasma (ICP) apparatus capable of generating high density plasma. Further, the present embodiment may use methane $CH_4$ together with He. In the present embodiment, the carbon nanotube film is grown with RF power fixed at 1 kW, at substrate temperature of 600 to 900.degree. C. Nitrogen gas or hydrogen gas can also be used to accelerate the reaction. When a carbon nanotube film is grown directly on the transparent electrodes 104, 110, or on the drain/source 18, or the channel 16, a catalytic metal layer (not shown) for growing carbon nanotubes can be formed on the surface of these portions. Alternatively, these area themself can be formed of catalytic metal.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. The light signal transfer device comprising:
   a substrate having a gate formed in said substrate;
   a MOS having gate dielectric layer, a source, a drain and a gate, said MOS being formed over said substrate;
   a photo-diode doped region formed adjacent to one of said source and drain doped regions; and
   pluralities of isolation layers laminated over said photo-diode doped region and at least one conductive pattern formed there between, wherein said conductive pattern is formed with carbon nano-tube, thereby providing a transparent electrode to increase a fill factor.

2. The light signal transfer device of claim 1, wherein said conductive pattern further includes conductive polymer.

3. The light signal transfer device of claim 1, a lens is formed over said pluralities of isolation layers to guide incident light into said photo-diode doped region.

4. The light signal transfer device comprising:
   a substrate having a gate formed in said substrate;
   a MOS having gate dielectric layer, a source, a drain and a gate, said MOS being formed over said substrate;
   a photo-diode doped region formed adjacent to one of said source and drain doped regions;
   at least one isolation layer formed over said photo-diode doped region; and
   at least one carbon nano-tube conductive pattern formed over said photo-diode doped region, to increase a fill factor or reduce infrared ray.

5. The light signal transfer device of claim 4, wherein said conductive pattern further includes conductive polymer.

6. The light signal transfer device of claim 4, a lens is formed over said pluralities of isolation layers to guide incident light into said photo-diode doped region.

* * * * *